United States Patent
Kanakarajan et al.

(10) Patent No.: US 8,124,223 B2
(45) Date of Patent: Feb. 28, 2012

(54) ARAMID FILLED POLYIMIDES HAVING ADVANTAGEOUS THERMAL EXPANSION PROPERTIES, AND METHODS RELATING THERETO

(75) Inventors: Kuppusamy Kanakarajan, Dublin, OH (US); Arnold Frances, Glen Allen, VA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/848,408

(22) Filed: Aug. 2, 2010

(65) Prior Publication Data

US 2010/0311901 A1  Dec. 9, 2010

Related U.S. Application Data

(62) Division of application No. 11/394,956, filed on Mar. 31, 2006, now Pat. No. 7,790,276.

(51) Int. Cl.
*C08G 73/10* (2006.01)
*B32B 27/06* (2006.01)

(52) U.S. Cl. ....... 428/220; 428/1.26; 428/209; 428/243; 428/344; 428/457; 428/458; 428/473.5; 524/94; 524/112; 524/113; 524/173; 524/211; 524/227; 524/233; 524/403; 524/404; 524/405; 524/408; 524/413; 524/415; 524/424; 524/428; 524/430; 524/436; 524/444; 524/445; 524/495; 524/432

(58) Field of Classification Search ............. 524/94, 524/112, 113, 173, 211, 227, 233, 403, 404, 524/405, 408, 413, 415, 424, 428, 430, 436, 524/444, 445, 495; 525/432, 436; 428/220, 428/209, 458, 473.5, 1.26, 243, 344, 457
See application file for complete search history.

(56) References Cited

U.S. PATENT DOCUMENTS

| | | | |
|---|---|---|---|
| 4,742,099 A | 5/1988 | Nagano et al. | |
| 5,218,034 A | 6/1993 | Milligan et al. | |
| 5,227,244 A | 7/1993 | Milligan | |
| 5,543,222 A | 8/1996 | Edman et al. | |
| 5,571,875 A | 11/1996 | Tsutsumi et al. | |
| 6,743,273 B2 | 6/2004 | Chung et al. | |
| 7,015,274 B2 | 3/2006 | Chen et al. | |
| 7,297,739 B2 | 11/2007 | Chen et al. | |
| 2003/0045606 A1 | 3/2003 | Kusaka et al. | |

*Primary Examiner* — Ana Woodward
(74) *Attorney, Agent, or Firm* — Konrad H. Kaeding

(57) ABSTRACT

The invention is directed to polyimide based adhesives having a coefficient of thermal expansion ("CTE") equal to or below 50 ppm/° C. The adhesives of the present invention contain a polyimide base polymer present in the overall adhesive in an amount from 25 to 95 weight percent. The polyimide base polymer has a glass transition temperature ("$T_g$") in a range of from about 150 to about 300° C. and typically has a coefficient of thermal expansion above 50 ppm/° C. The polyimide based adhesives of the invention also contain an aramid micro fiber filler in an amount from 5 to 75 weight percent, based upon the total weight of the polyimide based adhesive. The fiber filler can be used to lower CTE of the overall adhesive to match (or nearly match) the CTE of other materials like metal, silicon wafers, other polymers (including polyimide) and the like.

4 Claims, No Drawings

ARAMID FILLED POLYIMIDES HAVING ADVANTAGEOUS THERMAL EXPANSION PROPERTIES, AND METHODS RELATING THERETO

BACKGROUND OF THE INVENTION

1. Field of the Invention

The present invention relates generally to low glass transition temperature (low "$T_g$") polyimide adhesives having aramid type fibers incorporated therein. More specifically, the polyimide compositions of the present invention have advantageous coefficient of thermal expansion ("CTE") properties, thereby making the compositions particularly suitable and useful for metal bonding in electronics type applications or the like.

2. Discussion of Related Art

U.S. Pat. No. 6,743,273 to Chung et al. is directed to micro fibers having a diameter of 200 nanometers or less, useful as a filtering media, or useful as a filtering layer when deposited onto a cellulose substrate.

US Patent Application No. 2003-0045606 to Kusaka et al. teaches aramid resins having an average particle size of about 10 to 2000 microns. The aramid resins are used in combination with a binder (e.g., a phenol resin, an epoxy or a polyimide) to create a brake pad, brake drum, clutch plate or other friction intensive substrate.

SUMMARY OF THE INVENTION

The present invention is directed to polyimide based adhesives having a coefficient of thermal expansion ("CTE") equal to or below 50 ppm/° C., and in another embodiment, CTE in a range between and including any two of the following (in ppm/° C.): 5, 7, 10, 12, 15, 20, 25, 30, 35, 40, 45, 48 and 50 ppm/° C. The adhesives of the present invention comprise:
i. a polyimide base polymer having a glass transition temperature ("$T_g$") between and including any two of the following temperatures: 150, 160, 170, 175, 180, 200, 225, 250, 260, 265, 270, 275, 280, 285, 290, 295 and 300° C., wherein the polyimide base polymer has a CTE above 50 ppm/° C.; and ii. an aramid micro fiber filler component dispersed within the base polymer. Generally speaking, the polyimide base polymer will be in a range between and including any two of the following: 25, 35, 45, 50, 55, 60, 65, 70, 75, 80, 85, 90 or 95 weight percent of the weight of the overall polyimide based adhesive, and the aramid micro fiber will be in a range between and including any two of the following: 5, 7, 10, 12, 15, 18, 20, 30, 40, 50, 60, 70 and 75 weight percent, based upon the total weight of the polyimide based adhesive.

The aramid filled polyimide (or aramid filled polyimide precursor) is stretched or oriented in both the machine direction and transverse direction, thereby allowing further in-plane alignment of the aramid within the polyimide polymer matrix to provide useful thermal expansion properties in the x-y plane. Such stretching or orientation generally provides a consistent and predictable in-plane CTE along the entire substrate. Depending upon the particular embodiment chosen, stretching in the machine or transverse direction is at least 0.01, 0.1, 0.5, 1, 2, 3, 4, 5, 6, 7, 8, or 9 percent. The polyimide composites of the present invention are cured, or otherwise processed, to a tensile modulus (at 20° C.) greater than 100, 150, 200, 250, 300, 350, 400, 450, 500, 550, 600, 650, 675, 700, 725, 750, 775, 800, 825, or 850 kpsi.

DESCRIPTION OF THE PREFERRED EMBODIMENTS

The term 'polyimide base polymer' as used herein is intended to include any polyimide, such as, polyimides synthesized by a poly-condensation reaction involving the reaction of one or more aromatic dianhydrides (or derivations thereof suitable for synthesizing polyimides) with at least one or more types of diamines (e.g., aromatic diamines and aliphatic diamines, or derivations thereof suitable for synthesizing polyimides), polyimide esters, and polyimide ether esters.

In one embodiment, the diamine can be aliphatic, aromatic or a combination thereof. In such an embodiment, the mole ratio of aliphatic to aromatic diamine can be represented by the ratio A:B, where A is a range of from about 0, 5, 10, 15, 20, 25, 30, 35, 40, 45, 50, 55, 60, or 65 to about 70, 75, 80, 85, 90, 95 and 100, and where B is a range of from about 0, 5, 10, 15, 20 or 25, 30, 35, 40, 45 or 50, to about 55, 60, 65, 70, 75, 80, 85, 90, 95 and 100.

The term 'aramid micro fiber filler component' as used herein is intended to mean a rod-shaped structure, having a diameter between and including any two of the following numbers (in microns): 0.002, 0.005, 0.010, 0.025, 0.050, 0.100, 0.150, 0.200, 0.400, 0.600, 0.800, 1.000 and 2.000 microns (or about 2.0 to 2000 nanometers), provided the structure is derived, wholly or partially, from an aramid polymer. Suitable aramid micro fiber for use in the present invention include so-called aramid fiber pulp.

In one embodiment, polyimide (or a precursor thereto) film of the present invention is polymerized to a sufficient viscosity, and cured to a sufficient degree, to provide a film having the following properties:
A. a coefficient of thermal expansion ("CTE") of less than 50, 40, 30, 20, 15, 10 or 5 ppm/° C. (according to ASTM Method D-696-91),
B. a glass transition temperature from about 150, 160, 170, 180, or 185 to about 190, 200, 210, 220, 230, 240, 250, 260, 270, 280, 290 and 300° C.; and
C. a thickness from about 2, 3, 5, 7, 8, 10, 12, 15, 20, or 25 microns to about 25, 30, 35, 40, 45, 50, 60, 80, 100, 125, 150, 175, 200 microns.

The polyimide composites of the present invention can be manufactured in any one of many ways well known to those of ordinary skill in the art, using conventional or non-conventional polyimide manufacturing technology. Depending upon the amount of orientation or stretching (in combination with the amount and type of aramid filler selected) low coefficients of thermal expansion are possible, e.g., CTEs of less than 50, 25, 10, or 5 (ppm per ° C.) in a temperature range of 50° C. to 300° C.

In one embodiment, a polyimide adhesive composite of the present invention is prepared by reacting a diamine component with a dianhydride component in the presence of an organic solvent, thereby forming a polyamic acid solution. Thereafter, the aramid micro fiber filler component can be thoroughly mixed into the polyamic acid solution, optionally in combination with a suitable dispersing agent and/or other processing aid, and then, the polyamic acid can be cured into a polyimide by conventionally or non-conventionally known imidization processing of the polyamic acid.

I. Organic Solvents

Useful organic solvents for the synthesis of the low Tg polyimides of the present invention are preferably capable of dissolving the polyimide precursor materials (i.e., typical monomers used to form low Tg polyimides). Typically, these solvents can have a relatively low boiling point, such as below 225° C., so the polyimide can be dried at moderate (i.e., more convenient and less costly) temperatures. A boiling point of less than 210, 205, 200, 195, 190, or 180° C. can be preferred.

Solvents of the present invention may be used alone or in combination with other solvents (i.e., cosolvents). Useful organic solvents include: N-methylpyrrolidone (NMP), dimethylacetamide (DMAc), N,N'-dimethyl-formamide (DMF), dimethyl sulfoxide (DMSO), tetramethyl urea (TMU), diethyleneglycol diethyl ether, 1,2-dimethoxyethane (monoglyme), diethylene glycol dimethyl ether (diglyme), 1,2-bis-(2-methoxyethoxy)ethane (triglyme), bis[2-(2-methoxyethoxy)ethyl)]ether (tetraglyme), gamma-butyrolactone, and bis-(2-methoxyethyl)ether, tetrahydrofuran. In one embodiment, preferred solvents include N-methylpyrrolidone (NMP) and dimethylacetamide (DMAc).

Co-solvents can generally be used at about 5 to 50 weight percent of the total solvent, and useful such co-solvents include xylene, toluene, benzene, "Cellosolve" (glycol ethyl ether), and "Cellosolve acetate" (hydroxyethyl acetate glycol monoacetate).

II. Aramid Micro Fiber

The micro fibers of the present invention can be described as either being a 'fiber' or a 'fibril' as is commonly known in the fiber making industry. In one embodiment, the micro fibers (and micro 'fibrils') of the present invention have a diameter in a range between and including any two of the following (in microns): 0.002, 0.005, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, and 2.0 microns.

In one embodiment, the micro fibers of the present invention can be of any available length. In another embodiment, the average micro fiber length is in a range between and including any two of the following (in nanometers): $10^1$, $10^2$, $10^3$, $10^4$, $10^5$, $10^6$, and $10^7$ nanometers. Generally, the micro fibers can be dispersed into any organic solvent (or solvent system) that is compatible with making the particular polyimide selected, thereby creating a dispersion of micro fiber in solvent (hereafter sometimes referred to as the 'micro fiber filler component').

The micro fiber filler component can be mixed with a polyimide precursor material, such as, a polyamic acid solution comprising a suitable solvent and monomers for synthesizing a polyimide (or reaction products of such polyimide monomers). Alternatively, the micro fibers of the present invention can be directly dispersed into a polyamic acid or polyimide solution.

In one embodiment of the present invention, a dispersing agent is used to assist in the incorporation of the aramid micro fiber into the polyamic acid and/or polyimide solution. In one such embodiment, a fluorine-containing dispersing agent is added to the organic solvent, or co-solvent mixture (or solvent system) to form a dispersing solution. The dispersion solution can comprise a concentration of fluorine-containing dispersing agent between any two of the following numbers 0.1, 0.5, 1.0, 2.0, 4.0, 5.0, 10.0, 15.0 and 20.0 weight percent. The dispersing solution can then be used to disperse (along with shearing force if necessary) the aramid micro fiber component.

While the aramid micro fiber component can be added directly to the dispersing solution, it is possible to add the aramid micro fiber component to the organic solvent (co-solvent or solvent system) prior to adding the fluorine-containing dispersing agent. Generally speaking, the order of addition of these components is not critical to the practice of this invention. Useful fluorine-containing dispersing agents include ionic, non-ionic, amphoteric and anionic agents sold under the trade name ZONYL® and trade name NAFION® (manufactured by E. I. du Pont de Nemours and Co.). Other useful dispersing agents can include silanes, titanates, zirconates and the like.

Some aramid resins known to be useful as micro fiber materials include para-type, para-meta-type and meta-type aramid micro fibers. Para-aramid micro fibers for example are long-chain synthetic polyamides. A commonly used polyamide is poly(para-phenyleneterephthalamide). Generally speaking, para-aramid micro fibers have been produced commercially since about the early 1970s and can be a particularly useful type of aramid micro fiber in the practice of the present invention. Many of these fibers combine high tensile strength, high temperature resistance and low volume density, and as such, can be particularly useful as a 'reinforcing agent' in a polyimide adhesive. It has been discovered that such a reinforcing agent can lower the CTE of the polyimide adhesive formulation without materially lowering desired adhesiveness.

In one embodiment of the present invention, an 'abrasive-type' processing step can be used to produce small diameter "micro fibers" (or "micro fibrils") from larger fibers or even resin-based materials. Larger materials can be mechanically abraded to form the micro fibers (and micro fibrils) defined herein. During an abrasion processing step, typically, the micro fibers are released via mechanical grinding and captured in a separation process. Alternatively, micro fibers can be purchased directly from manufacturers of larger fiber materials as a specialty product. Some commercially available aramid resins, sold either as a micro fiber or larger fiber (that can be abraded to form a micro fiber) include those fibers known as KEVLAR® (made by E. I. du Pont de Nemours and Co.), NOMEX® (made by E. I. du Pont de Nemours and Co.), and TECHNORA® and CONNEX® (both made by Teijin Corporation of Japan).

In one embodiment of the present invention, a micro fiber is derived from DuPont manufactured KEVLAR® fiber chemically known as poly-p-phenylene-terephthalamide. One type of this broad product offering is a particular KEVLAR® fiber sold commercially as a micro fiber. This micro fiber can be dispersed into dimethylacetamide, a commonly used organic solvent to manufacture polyimides. Other useful micro fibers of the present invention include (or can be derived from), but are not limited to, NOMEX® fibers (known as poly-m-phenylene-isophthalamide), TECHNORA® fibers (known as copoly-p-phenylene-3,4'-oxy-diphenyleneterephthalamide), and CONNEX® fibers (known as poly-m-phenylene(p-phenylene)isophthalamide).

In one embodiment of the present invention, a micro fiber and/or a micro fiber filler component, is added to a polyimide adhesive precursor material (i.e., typically a polyamic acid) to form a mixed polymer blend. Polyimide precursor materials can typically be a polyamic acid, or in some cases can be a soluble polyimide. Generally, the polyamic acids of the present invention (when cured to form a polyimide) can form polymer that is useful as an adhesive, i.e. can form a polyimide polymer having a glass transition temperature of between about 150° C. and 300° C. Typically, these polyamic acids can be dried of solvent and heated at higher temperatures to form a polyimide (via a polycondensation reaction known as imidization) to form a polyimide adhesive composite.

In one embodiment of the present invention, a dimensionally stable (i.e., thermally dimensionally stable) polyimide adhesive film composite is formed having dispersed therein an amount of micro fiber between (and including) any two of the following numbers, 5, 10, 15, 20, 25, 30, 35, 40, 45, 50, 55, 60, 65, 70 and 75 weight percent (based on the total weight of the polyimide adhesive composite). Depending on the amount of thermal stability required in the composite's end use application, the amount of micro fiber present in the polyimide composite can be controlled to produce a composite having a particular coefficient of thermal expansion (CTE). In some end use applications, it can be critical to match the CTE of the polyimide composite to the CTE of the material that the composite is being bonded to (i.e., typically a metal or metal foil). For polyimide adhesives requiring lower CTE values, a larger amount of micro fiber filler component may be necessary. For higher CTE value applications, less filler component may be necessary.

In one embodiment of the present invention, a micro fiber is dispersed into an organic solvent (or co-solvent or mixture of solvents and co-solvents) that is compatible with a polyimide or polyimide precursor material. The micro fiber can be dispersed in the solvent an amount ranging from about 1 to 60 weight-percent. The micro fiber is typically well dispersed, (i.e., dispersed to an average particle size of about 20 to 20,000 nanometers), or the elemental particle size of the nanofiber material if possible, to prevent an unwanted level of agglomeration. Unwanted agglomerated micro fibers can typically be ground down to a size where the advantageous properties of a polyimide film are not adversely affected (i.e., good dielectric strength, good mechanical properties, and good adhesivity to other materials) via a variety of commonly known dispersion techniques (e.g., milling). Typically, the average particle size of the micro fiber filler component of the present invention (after grind, or using a dispersing agent, or both) is between and including any two of the following numbers (in microns): 0.002, 0.100, 0.200, 0.500, 0.800, 1.00 and 2.00 microns.

In one embodiment of the present invention, a micro fiber derived from a para-type aramid polymer is used. The micro fiber can be represented by the formula below,

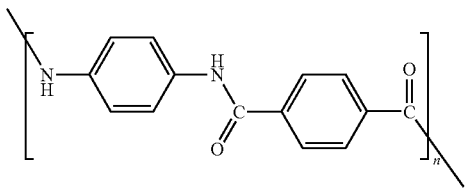

where n is equal to any number between 10 and 10 million. The aramid micro fiber can also be described as para-phenyleneterephthalamide (PPD-T). As a fiber, this material has a tensile strength 5 times stronger than steel and is mechanically tough (non-brittle). PPD-T fiber typically degrades at about 500° C. and does not expand or shrink (to a significant degree) under thermal stress making the material ideal as a polyimide filler component. Commonly, this material can be found in the literature or described as, a 'friction product' meaning that it responds well in wear testing.

III. Polyimide Monomers

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

As used herein, an "aromatic diamine" is intended to mean a diamine having at least one aromatic ring, either alone (i.e., a substituted or unsubstituted, functionalized or unfunctionalized benzene or similar-type aromatic ring) or connected to another (aromatic or aliphatic) ring, and such an amine is to be deemed aromatic, regardless of any non-aromatic moieties that might also be a component of the diamine. Hence, an aromatic diamine backbone chain segment is intended to mean at least one aromatic moiety between two adjacent imide linkages. As used herein, an "aliphatic diamine" is intended to mean any organic diamine that does not meet the definition of an aromatic diamine.

Similarly, the term dianhydride, as used herein, is intended to mean a component that reacts with (or is complimentary to) a diamine, and in combination is capable of reacting to form an intermediate polyamic acid (which can then be cured into a polyimide). Depending upon the context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e., a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

In one embodiment, useful aliphatic diamines have the following structural formula: $H_2N-R-NH_2$, where R is an aliphatic moiety, such as a substituted or unsubstituted hydrocarbon in a range from 4, 5, 6, 7 or 8 carbons to about 9, 10, 11, 12, 13, 14, 15, or 16 carbon atoms, and in one embodiment the aliphatic moiety is a $C_6$ to $C_8$ aliphatic.

In one embodiment, R is a $C_6$ straight chain hydrocarbon, known as hexamethylene diamine (HMD or 1,6-hexanediamine). In other embodiments, the aliphatic diamine is an alpha, omega-diamine; such diamines can be more reactive than alpha, beta-aliphatic diamines.

In one embodiment, to achieve low temperature bonding ("low temperature bonding" is intended to mean bonding two materials in a temperature range of from about 180, 185, or 190° C. to about 195, 200, 205, 210, 215, 220, 225, 230, 235, 240, 245 and 250° C.).

In one embodiment of the present invention, an aliphatic diamine is 75±10, 8, 6, 4, 2 or 1 mole % hexamethylene diamine (HMD) and an aromatic diamine is 25±10, 8, 6, 4, 2 or 1 mole %, 1,3-bis-(4-aminophenoxy)benzene (APB-134, RODA). Here, the glass transition temperature of the polyimide adhesive is in a range of about 175±10° C. At a lamination temperature (bonding temperature) of about 200±10, 8, 6, 4, 2 or 1° C., the polyimide adhesive can be a viable substitute for an acrylic or epoxy coverlay composition, compositions commonly used as conformal coatings and encapsulates in electronics applications.

Depending upon the particular embodiment of the present invention, other suitable aliphatic diamines include, 1,4-tetramethylenediamine, 1,5-pentamethylenediamine (PMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. A preferred aliphatic diamine can be hexamethylene diamine (HMD).

In another embodiment of the present invention, from about 5, 10, 15, 20, or 25 mole % to about 30, 35, 40, 45, and above, but less than 50 mole % of the diamine component of the polyimide adhesives of the present invention are aromatic diamines. Other suitable aromatic diamines include, m-phenylenediamine, p-phenylenediamine, 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl)propane, 4,4'-diaminobiphenyl, 4,4'-diaminobenzophenone, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether, 3,4'-diaminodiphenyl ether, 4,4'-diaminobenzophenone, 4,4'-isopropylidenedianiline, 2,2'-bis-(3-aminophenyl) propane, N,N-bis-(4-aminophenyl)-n-butylamine, N,N-bis-(4-aminophenyl)methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl)aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl)ether, p-bis-2-(2-methyl-4-aminopentyl)benzene, m-xylylene diamine, and p-xylylene diamine.

Other useful aromatic diamines include, 1,2-bis-(4-aminophenoxy)benzene, 1,3-bis-(4-aminophenoxy)benzene, 1,2-bis-(3-aminophenoxy)benzene, 1,3-bis-(3-aminophenoxy)benzene, 1-(4-aminophenoxy)-3-(3-aminophenoxy)benzene, 1,4-bis-(4-aminophenoxy)benzene, 1,4-bis-(3-aminophenoxy)benzene, 1-(4-aminophenoxy)-4-(3-aminophenoxy)benzene, 2,2-bis-(4-[4-aminophenoxy]phenyl)propane (BAPP), 2,2'-bis-(4-aminophenyl)-hexafluoro propane (6F diamine), 2,2'-bis-(4-phenoxy aniline)isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine] (1,2,4-OBABTF), 4,4'-oxy-bis-[3-trifluoromethyl) benzene amine],4,4'-thio-bis-[(2-trifluoromethyl)benzene-amine], 4,4'-thiobis[(3-trifluoromethyl)benzene amine], 4,4'-sulfoxyl-bis-[(2-trifluoromethyl)benzene amine, 4,4'-sulfoxy]-bis-[(3-trifluoromethyl)benzene amine], and 4,4'-keto-bis-[(2-trifluoromethyl)benzene amine].

In one embodiment, the preferred aromatic diamines are the isomers of bis-aminophenoxybenzenes (APB), aminophenoxyphenylpropane (BAPP), dimethylphenylenediamine (DPX), bisaniline P, and combinations thereof. In certain embodiments, the use of these particular diamines can lower the lamination temperature of the adhesive, and will increase the peel strength of the adhesive to other materials, especially metals.

Aromatic Dianhydrides

In this embodiment, any aromatic dianhydride or combination of aromatic dianhydrides can be used as the dianhydride monomer in forming the polyimide. These dianhydrides may be used alone or in combination with one another. The dianhydrides can be used in their tetra-acid form (or as mono, di, tri, or tetra esters of the tetra acid), or as their diester acid halides (chlorides). However in some embodiments, the dianhydride form can be preferred, because it is generally more reactive than the acid or the ester.

Examples of suitable aromatic dianhydrides include, 1,2, 5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 2,2',3,3'-benzophenone tetracarboxylic dianhydride, 2,3,3',4'-benzophenone tetracarboxylic dianhydride, 3,3',4, 4'-benzophenone tetracarboxylic dianhydride (BTDA), 2,2', 3,3'-biphenyl tetracarboxylic dianhydride, 2,3,3',4'-biphenyl tetracarboxylic dianhydride, 3,3',4,4'-biphenyl tetracarboxylic dianhydride (BPDA), bicyclo-[2,2,2]-octen-(7)-2,3,5,6-tetracarboxylic-2,3,5,6-dianhydride, 4,4'-thio-diphthalic anhydride, bis(3,4-dicarboxyphenyl)sulfone dianhydride, bis (3,4-dicarboxyphenyl)sulfoxide dianhydride (DSDA), bis(3, 4-dicarboxyphenyl oxadiazole-1,3,4) p-phenylene dianhydride, bis(3,4-dicarboxyphenyl) 2,5-oxadiazole 1,3,4-dianhydride, bis 2,5-(3',4'-dicarboxydiphenylether) 1,3,4-oxadiazole dianhydride, 4,4'-oxydiphthalic anhydride (ODPA), bis(3,4-dicarboxyphenyl)thio ether dianhydride, bisphenol A dianhydride (BPADA), bisphenol S dianhydride, 2,2-bis-(3,4-dicarboxyphenyl) 1,1,1,3,3,3-hexafluoropropane dianhydride (6FDA), 5,5-[2,2,2]-trifluoro-1-(trifluoromethyl)ethylidene, bis-1,3-isobenzofurandione, 1,4-bis(4, 4'-oxyphthalic anhydride)benzene, bis(3,4-dicarboxyphenyl)methane dianhydride, cyclopentadienyl tetracarboxylic acid dianhydride, cyclopentane tetracarboxylic dianhydride, ethylene tetracarboxylic acid dianhydride, perylene 3,4,9,10-tetracarboxylic dianhydride, pyromellitic dianhydride (PMDA), tetrahydrofuran tetracarboxylic dianhydride, 1,3-bis-(4,4'-oxydiphthalic anhydride)benzene, 2,2-bis(3,4-dicarboxyphenyl) propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2, 3,4-tetracarboxylic dianhydride; and thiophene-2,3,4,5-tetracarboxylic dianhydride.

IV. Preparation of the Polyimide Adhesives

A polyimide film according to the present invention can be produced by combining the diamine and dianhydride (monomer or other polyimide precursor form) together with a solvent to form a polyamic acid (also called a polyamide acid) solution. The dianhydride and diamine can be combined in a molar ratio of about 0.90 to 1.10. Molecular weight of the polyamic acid formed therefrom can be adjusted by adjusting the molar ratio of the dianhydride and diamine.

In one embodiment of the present invention, a micro fiber material (or micro fiber pulp) is dispersed in a solvent (a solvent that is compatible with polyamic acid) to form a particle dispersion. These micro fibers can be dispersed into an organic solvent using any one of a variety of mechanical mixing techniques including, but not limited to, kinetic dispersion, ball (or media) milling, ultra sonic mixing and the like. Agglomerates of larger micro fiber component can be dispersed to an average particle size of about 20 to 20,000 nanometers or about 100 to 2,000 nanometers. Typically the amount of micro fiber added to a solvent can range from about 1 to 60 weight percent. As such, the particle filler dispersion (referred to herein as the micro fiber filler component) can be mixed with a polyamic acid (or monomers used to make a polyamic acid) or can be mixed with a soluble polyimide already in solution.

In one embodiment of the present invention, a polyamic acid casting solution is derived from a polyamic acid solution mixed with micro fiber filler component. The amount of micro fiber in the polyamic acid casting solution can range from 5 to 75 weight percent based on the weight of polyamic acid solids. In one embodiment, the polyamic acid casting solution can also comprise conversion chemicals like: (i.) one or more dehydrating agents, such as, aliphatic acid anhydrides (acetic anhydride, etc.) and/or aromatic acid anhydrides; and (ii.) one or more catalysts, such as, aliphatic tertiary amines (triethyl amine, etc.), aromatic tertiary amines (dimethyl aniline, etc.) and heterocyclic tertiary amines (pyridine, picoline, isoquinoline, etc.). The anhydride dehydrating material it is often used in molar excess compared to the amount of amide acid groups in the polyamic acid. The amount of acetic anhydride used is typically about 2.0-3.0 moles per equivalent of polyamic acid. Generally, a comparable amount of tertiary amine catalyst is used. In one embodiment, the polyamic acid solution, and/or the polyamic acid casting solution, is dissolved in an organic solvent at a concentration from about 5.0 or 10.0% or to about 15, 20, 25, 30, 35 and 40% by weight.

In one embodiment of the present invention, the polyamic acid (and casting solution) can optionally comprise any one of a number of other additives including, but not limited to, processing aids (e.g., oligomers), antioxidants, light stabilizers, flame retardant additives, anti-static agents, heat stabilizers, ultraviolet absorbing agents, and other inorganic fillers.

Other inorganic fillers, for purposes of this invention, can include thermally conductive fillers like metal oxides, electrically conductive fillers like metals, and electrically conductive polymers. Common inorganic fillers include, but are not limited to, alumina, silica, silicon carbide, diamond, clay, boron nitride, aluminum nitride, titanium dioxide, dicalcium phosphate, fumed metal oxides, barium titanate, silicon carbide, diamond, dicalcium phosphate, silver, palladium, gold, platinum, nickel, copper or mixtures or alloys of these materials, paraelectric filler powders like $Ta_2O_5$, $HfO_2$, $Nb_2O_5$, $Al_2O_3$, steatite and mixtures these, perovskites of the general formula $ABO_3$, crystalline barium titanate (BT), barium strontium titanate (BST), lead zirconate titanate (PZT), lead lanthanum titanate, lead lanthanum zirconate titanate (PLZT), lead magnesium niobate (PMN), calcium copper titanate, and combinations thereof. Common electrically conductive fillers include carbon and graphite. Common electrically conductive polymers include polyaniline, polythiophene, polypyrrole, polyphenylenevinylene and polydialkylfluorenes.

The solvated mixture (the polyamic acid casting solution) can then be cast or applied onto a support, such as an endless belt or rotating drum, to give a solvent-containing film. In the case of the casting solution comprising a soluble polyimide (in lieu of a polyamic acid) the casting solution can be sold as a paste or can be coated (and then dried) onto another substrate and sold as a laminate. In another instance, the paste can be coated onto electrical components, or portions of an electrical circuit, to serve as an adhesive to join other electrical component or materials.

Next, the solvent containing-film can be converted into a self-supporting film by baking at an appropriate temperature (thermal curing) optionally with conversion chemical reactants (chemical curing) or without. The film can then be separated from the support, oriented such as by tentering, with continued thermal and chemical curing to provide a polyimide adhesive film composite.

Useful methods for producing polyimide film in accordance with the present invention can be found in U.S. Pat. Nos. 5,166,308 and 5,298,331 are incorporate by reference into this specification for all teachings therein. Numerous variations are also possible, such as, (a) A method wherein the diamine components and dianhydride components are preliminarily mixed together and then the mixture is added in portions to a solvent while stirring.

(b) A method wherein a solvent is added to a stirring mixture of diamine and dianhydride components. (contrary to (a) above)

(c) A method wherein diamines are exclusively dissolved in a solvent and then dianhydrides are added thereto at such a ratio as allowing control of the reaction rate.

(d) A method wherein the dianhydride components are exclusively dissolved in a solvent and then amine components are added thereto at such a ratio to allow control of the reaction rate.

(e) A method wherein the diamine components and the dianhydride components are separately dissolved in solvents and then these solutions are mixed in a reactor.

(f) A method wherein the polyamic acid with excessive amine component and another polyamic acid with excessive dianhydride component are preliminarily formed and then reacted with each other in a reactor, particularly in such a way as to create a non-random or block copolymer.

(g) A method wherein a specific portion of the amine components and the dianhydride components are first reacted and then the residual diamine components are reacted, or vice versa.

(h) A method wherein the conversion chemicals are mixed with the polyamic acid to form a polyamic acid casting solution and then cast to form a gel film.

(i) A method wherein the components are added in part or in whole in any order to either part or whole of the solvent, also where part or all of any component can be added as a solution in part or all of the solvent.

(j) A method of first reacting one of the dianhydride components with one of the diamine components giving a first polyamic acid, then reacting the other dianhydride component with the other amine component to give a second polyamic acid, then combining the amic acids in any one of a number of ways prior to film formation.

The thickness of the polyimide adhesive film composites of the present invention may be adjusted depending on the intended purpose of the film or final application specifications. It is generally preferred that the thickness of the film ranges from 2, 3, 5, 7, 8, 10, 12, 15, 20, or 25 microns to about 25, 30, 35, 40, 45, 50, 60, 80, 100, 125, 150, 175, 200, 300, 400 or 500 microns. Preferably, the thickness is from about 8 to about 125 microns, more preferably from 12 to 25 microns.

Polyimide films according to the present invention can be used as a base film adhesive for a laminate for incorporation into a flexible printed circuit board ("FPC"). In one embodiment, a flexible printed circuit board ("FPC") can be produced as follows:

1. laminating a copper or other conductive foil (or conductive layer) to the adhesive polyimide;
2. forming a circuit pattern (broadly speaking: application of a resist, photo-patterning and development of the resist, copper etching and removal of the resist).

In one embodiment, the films of the present invention are used as a coverlay film. Coverlay films are laminated to etched circuitry traces (metal traces) of a flexible printed circuit board. The adhesive polyimide encapsulates the copper circuitry, protecting it from the environment and providing electrical and thermal insulation. The flexible printed circuit board, covered with the films of the present invention, may be single sided, double sided, or be incorporated into a stack of several individual flexible printed circuits to form what is commonly referred to as a multilayer board. Any of these types of circuits may be used in a solely flexible printed circuit or may be combined with rigid circuitry applications to form a rigid/flex or flex/rigid printed wiring board.

In one embodiment, the polyimide adhesive composites of the present invention are cast alone to form a sheet adhesive material useful as a center layer in a metal laminate structure, or as a coverlay material for a printed circuit board.

The adhesion strength of the above-described laminates can be improved by employing various techniques for elevating adhesion strength. For example, prior to the step of applying the adhesives of the present invention onto a metal foil, or the exposed circuitry in a coverlay application, the polyimide can be subjected to a pre-treatment step. These pre-treatment steps include heat treatment, corona treatment, plasma treatment under atmospheric pressure, plasma treatment under reduced pressure, treatment with coupling agents like silanes and titanates, sandblasting, alkali-treatment, acid-treatments, and coating polyamic acids. To improve the adhesion strength, it is generally also possible to add various metal compounds as disclosed in U.S. Pat. Nos. 4,742,099; 5,227,244; 5,218,034; and 5,543,222 incorporated herein by reference.

The polyimide adhesive composites (and casting solution precursors) of the present invention can be applied to a metal foil and cured to form a polyimide metal laminate. Application of the adhesive casting solution of the present invention can be accomplished in any number of ways. Such methods include using a slot die, dip coating, or kiss-roll coating a metal foil followed by metering with doctor knife, doctor rolls, squeeze rolls, or an air knife. The coating may also be applied by brushing or spray coating. By using such techniques, it is possible to prepare both one and two-sided coated laminates. In preparation of the two-side coated structures, one can apply a metal coating (via an electrolytic or electroless sputtering and plating process) to one side (or both sides) of a polyimide adhesive film composite.

The polyimide adhesive composite films of the present invention may be prepared by either a chemical or thermal conversion process and may be surface treated, e.g., by chemical etching, corona treatment, laser etching, etc., to improve adhesion.

A single polyimide metal-clad of the present invention comprises a flexible polyimide layer which adheres to a metal foil such as copper, aluminum, nickel, steel or an alloy containing one or more of these metals. The polyimide layer adheres firmly to the metal and has a peel strength of 2 pounds per linear inch and higher. The metal may be adhered to one or both sides of the polyimide layer.

The polyimide adhesive films of the present invention will bond to copper at from about 2 pounds per linear inch to about 15 pounds per linear inch. A bonding temperature can be between 180° C. and 350° C. In one embodiment, a polyimide adhesive of the present invention bonded to copper with a bonding strength of about 8 pounds per linear inch, a bonding temperature of 200° C., and a glass transition temperature of about 165 to 220° C.

As used herein, the term "conductive layers" and "conductive foils" are meant to be metal layers or metal foils. Conductive foils are typically metal foils. Metal foils do not have to be used as elements in pure form; they may also be used as metal foil alloys, such as copper alloys containing nickel, chromium, iron, and other metals. The conductive layers may also be alloys of metals and are typically applied to the polyimides of the present invention via a sputtering step followed by an electro-plating step. In these types of processes, a metal seed coat layer is first sputtered onto the polyimide adhesive. Finally, a thicker coating of metal is applied to the seed coat via electro-plating or electro-deposition. Such sputtered metal layers may also be hot pressed above the glass transition temperature of the polymer for enhanced peel strength.

Conductive foils are also useful. Particularly suitable metallic substrates are foils of rolled, annealed copper or rolled, annealed copper alloy. In many cases, it has proved to be of advantage to pre-treating the metallic substrate before coating. This pretreatment may include, but is not limited to, electro-deposition or immersion-deposition on the metal of a thin layer of copper, zinc, chrome, tin, nickel, cobalt, other metals, and alloys of these metals. The pretreatment may consist of a chemical treatment or a mechanical roughening treatment. It has been found that this pretreatment enables the adhesion of the polyimide layer and, hence, the peel strength to be further increased. Apart from roughening the surface, the chemical pretreatment may also lead to the formation of metal oxide groups, enabling the adhesion of the metal to the polyimide layer to be further increased. This pretreatment may be applied to both sides of the metal, enabling enhanced adhesion to substrates on both sides.

The polyimides of the present invention provide many attributes not common to materials that bond in the temperature range of from about 180° C. to 300° C. Firstly, the polyimide adhesive composites of the present invention provide superior thermal resistance and x-y in-plane dimensional stability. In thin film or laminate construction, dimensional stability is measured in ppm/° C. and is typically referred to with respect to the x-y plane. Typically, the thermal expansion coefficient of a polyimide adhesive film, without micro fiber filler component, is in the range of about 50 to 150 ppm/° C. But, the polyimide adhesive film composites of the present invention, because they are reinforced, have a coefficient of thermal expansion of less than 50, 40, 30, 20, 15, 10, or 5 ppm/° C. (according to ASTM Method D-696-91). This makes these materials ideal for applications requiring thermal stability in an adhesive. Most acrylics for example have a thermal coefficient of expansion of about 300 to 400 ppm/° C. The coefficient of thermal expansion as defined herein is measured by ASTM Method D-696-91, the test method included herein by reference.

The polyimide adhesive composites of the present invention can be used for electrically insulating electronic parts, electronic circuit boards, and electronic equipment or are particularly useful for die pad bonding of flexible print connection boards or semiconductor devices or packaging materials for CSP (chip scale package), chip on flex (COF), COL (chip on lead), LOC (lead on chip), multi-chip module ("MCM"), ball grid array ("BGA" or micro-ball grid array), and/or tape automated bonding ("TAB").

In one embodiment, the polyimide adhesive film composites of the present invention are used for wafer level integrated circuit packaging where the polyimide adhesive composite is directly bonded to a silicon wafer either as a cured polyimide or coated as a polyamic acid casting solution and then cured. In one embodiment, (i.e., a wafer level integrated circuit packaging) the conductive passageway is connected to the dies by a conductive passageway, such as a wire bond, a conductive metal, a solder bump or the like.

In one embodiment, the polyimide based adhesive material of the present invention is a film having a film thickness between 2 and 200 microns, where the CTE of the polyimide based adhesive material is in a range between and including 50 and 5 ppm/° C.

In one embodiment of the present invention, the polyimide based adhesive material is part of a polyamic acid paste. In other embodiments, the polyimide adhesive based compositions of the present invention are used as an electronic substrate material, such as, a circuit coverlay layer, a flexible polyimide metal-clad laminate, a circuit board, or a semiconductor device package. Useful semiconductor device packages of the present invention include chip on lead ("COL") packages, chip on flex ("COF") packages, lead on chip ("LOC") packages, multi-chip module ("MCM") packages, ball grid array ("BGA" or "µ-BGA") packages, chip scale packages ("CSP"), tape automated bonding ("TAB") packages, and/or a wafer level integrated circuit packages.

In one embodiment, the electronic substrate material of the present invention is a printed wiring board capable of operating above 1 GHz, a planar transformer component of a power supply device, a flexible heater circuit, or a flex/rigid or rigid/flex wiring board.

In another embodiment, the electronic substrate material of the present invention comprises a metal layer, wherein a bond strength between the polyimide based adhesive material and the metal layer, as determined by ASTM Method IPC-TM-650 Method No. 2.4.9.D, is greater than 2 pounds per linear inch (pli).

In another embodiment of the present invention, the polyimide adhesive material composition further comprises an additional filler material selected from a group consisting of alumina, silica, boron nitride, silicon carbide, clay, diamond, dicalcium phosphate, aluminum nitride, titanium dioxide, polyaniline, polythiophene, polypyrrole, polyphenylenevinylene, polydialkylfluorenes, carbon black, graphite and combinations thereof.

The advantageous properties of this invention can be observed by reference to the following Examples that illustrate, but do not limit, the present invention. All parts and percentages are by weight unless otherwise indicated.

EXAMPLE 1

0.3 mole (87.7 gm) of 1,3-bis-(4-aminophenoxy)benzene (APB-134) was dissolved in 750 ml of Dimethyl acetamide (DMAc) solvent using a 1 liter beaker. The beaker was placed in dry box and well stirred.

A mixture of 0.24 mole (74.46 g) 4,4'-oxydiphthalic anhydride (ODPA) and 0.06 mole (13.08 g) of pyromellitic dianhydride (PMDA) was prepared as the dianhydride mixture.

Ninety five percent of the dianhydride mixture was slowly added to the diamine solution over a period of 15 minutes. The temperature of the solution was allowed to rise over 40 C. The viscosity was about 50 poise.

Next, about 25 g of finely cut KEVLAR® micro fiber was dispersed in 500 g of DMAc. The micro fiber was ground using a media mill where the material was circulated through the mill for about 2 hours to form a micro fiber dispersion.

22 g of the micro fiber dispersion was added to a portion of the 50-poise polyamic acid solution to form a 5.0 weight percent mixture (i.e., about 5 weight percent micro fiber per 95 percent polyamic acid polymer on a solids basis). The remainder of the dianhydride solution was added to the mixture (and milling continued for 14 hours) to make polymer solution having about 500 poise.

A portion of the polymer solution (at 500 poise) was cast onto a glass plate using a doctor blade to make a 25-micron thick film. The glass plate was dried on a hot plate set at a temperature of 100° C. The film peeled from the plate and placed on a pin frame. Then, it was dried and cured in an oven. The temperature profile of the oven was set at 120 to 300° C. (for 1 hr) at an increase rate of 5° C./minute. After, the film was cured at 350° C. for 5 minutes. The CTE of the film was about 50 ppm/° C. and the glass transition temperature was about 220° C.

EXAMPLE 2

0.3 mole (87.7 gm) of 1,3-bis-(4-aminophenoxy)benzene (APB-134) was dissolved in 750 ml of Dimethyl acetamide (DMAc) solvent using a 1 liter beaker. The beaker was placed in dry box and well stirred.

A mixture of 0.24 mole (74.46 g) 4,4'-oxydiphthalic anhydride (ODPA) and 0.06 mole (13.08 g) of pyromellitic dianhydride (PMDA) was prepared as the dianhydride mixture.

Ninety five percent of the dianhydride mixture was slowly added to the diamine solution over a period of 15 minutes. The temperature of the solution was allowed to rise over 40° C. The viscosity was about 50 poise.

Next, about 25 g of finely cut KEVLAR® micro fiber was dispersed in 500 g of DMAc. The micro fiber was ground using a media mill where the material was circulated through the mill for about 2 hours to form a micro fiber dispersion.

33 g of the micro fiber dispersion was added to a portion of the 50-poise polyamic acid solution to form a 7.5 weight percent mixture (i.e., about 7.5 weight percent micro fiber per 92.5 percent polyamic acid polymer on a solids basis). The remainder of the dianhydride solution was added to the mixture (and milling continued for 14 hours) to make polymer solution having about 500 poise.

A portion of the polymer solution (at 500 poise) was cast onto a glass plate using a doctor blade to make a 25-micron thick film. The glass plate was dried on a hot plate set at a temperature of 100° C. The film peeled from the plate and placed on a pin frame. Then, it was dried and cured in an oven. The temperature profile of the oven was set at 120 to 300° C. (for 1 hr) at an increase rate of 5° C./minute. After, the film was cured at 350° C. for 5 minutes. The CTE of the film was about 38 ppm/° C. and the glass transition temperature was about 22° C.

EXAMPLE 3

0.3 mole (87.7 gm) of 1,3-bis-(4-aminophenoxy)benzene (APB-134) was dissolved in 750 ml of Dimethyl acetamide (DMAc) solvent using a 1 liter beaker. The beaker was placed in dry box and well stirred.

A mixture of 0.24 mole (74.46 g) 4,4'-oxydiphthalic anhydride (ODPA) and 0.06 mole (13.08 g) of pyromellitic dianhydride (PMDA) was prepared as the dianhydride mixture.

Ninety five percent of the dianhydride mixture was slowly added to the diamine solution over a period of 15 minutes. The temperature of the solution was allowed to rise over 40 C. The viscosity was about 50 poise.

Next, about 25 g of finely cut KEVLAR® micro fiber was dispersed in 500 g of DMAc. The micro fiber was ground using a media mill where the material was circulated through the mill for about 2 hours to form a micro fiber dispersion.

50 g of the micro fiber dispersion was added to a portion of the 50-poise polyamic acid solution to form a 10.0 weight percent mixture (i.e., about 10.0 weight percent micro fiber per 90 percent polyamic acid polymer on a solids basis). The remainder of the dianhydride solution was added to the mixture (and milling continued for 14 hours) to make polymer solution having about 500 poise.

A portion of the polymer solution (at 500 poise) was cast onto a glass plate using a doctor blade to make a 25-micron thick film. The glass plate was dried on a hot plate set at a temperature of 100° C. The film peeled from the plate and placed on a pin frame. Then, it was dried and cured in an oven. The temperature profile of the oven was set at 120 to 300° C. (for 1 hr) at an increase rate of 5° C./minute. After, the film was cured at 350° C. for 5 minutes. The CTE of the film was about 30 ppm/° C. and the glass transition temperature was about 220° C.

COMPARATIVE EXAMPLE 1

1.00 moles of 1,3-bis-(4-aminophenoxy)benzene (APB-134) was dissolved in dry dimethylacetamide (DMAc) solvent using a 1-liter beaker. The beaker was placed in a dry box. The mixture was stirred well and the temperature raised to 50° C.

A mixture of oxydiphthalic anhydride (ODPA) and pyromellitic dianhydride (PMDA) was prepared as the dianhydride mixture. The amount of ODPA was 0.8 moles and the amount of PMDA was 0.20 moles.

Ninety-five percent by weight of the dianhydride mixture was added slowly to the diamine, over a period of 10 minutes. The exothermic reaction was allowed to rise to 80° C. to ensure complete reaction of the diamines and dianhydrides to form a polyamic acid solution. The viscosity of the polyamic acid was adjusted, by adding a portion of the remaining dianhydride, to a desirable value anywhere from 50 poise to 1000 poise. The polyamic acid solution was stirred for an additional 1 hour, at 35° C.

A small portion of the polyamic acid solution was cast on a glass plate. The casting was dried on a hot plate at 80° C. for 30 minutes. A two mil (two thousands of an inch) thick film was produced.

The film was peeled from the glass plate and placed on a steel pin frame. Then the film was dried (and partially cured) in a high temperature oven. The starting temperature was 80° C., and temperature was increased to 250° C. at a rate of 5° C./min. The film was removed from the oven and cured for an additional 5.0 minutes in an oven set at 330° C. The CTE of this polyimide adhesive was 60 ppm/° C. and the glass transition temperature was 220° C.

COMPARATIVE EXAMPLE 2

0.25 moles of 1,3-bis-(4-aminophenoxy)benzene (APB-134) and 0.75 moles 1,6-hexanediamine (HMD) were dissolved in dry dimethylacetamide (DMAc) solvent using a 1-liter beaker. The beaker was placed in a dry box. The mixture was stirred well and the temperature raised to 50° C.

A mixture of biphenyltetracarboxylic dianhydride (BPDA) and benzophenone tetracarboxylic dianhydride (BTDA) was prepared as the dianhydride mixture. The amount of BPDA was 0.9 moles and the amount of BTDA was 0.10 moles.

Ninety-five percent by weight of the dianhydride mixture was added slowly to the diamine, over a period of 10 minutes. The exothermic reaction was allowed to rise to 80° C. to ensure complete reaction of the diamines and dianhydrides to form a polyamic acid solution. The viscosity of the polyamic acid was adjusted, by adding a portion of the remaining dianhydride, to a desirable value anywhere from 50 poise to 1000 poise. The polyamic acid solution was stirred for an additional 1 hour, at 35° C.

A small portion of the polyamic acid solution was cast on a glass plate. The casting was dried on a hot plate at 80° C. for 30 minutes. A two mil (two thousands of an inch) thick film was produced.

The film was peeled from the glass plate and placed on a steel pin frame. Then the film was dried (and partially cured) in a high temperature oven. The starting temperature was 80° C., and temperature was increased to 250° C. at a rate of 5° C./min. The film was removed from the oven and cured for an additional 5.0 minutes in an oven set at 330° C. The CTE of this polyimide adhesive was 56 ppm/° C. and the glass transition temperature was 175° C.

What is claimed is:

1. An electronic substrate material comprising:
    a polyimide adhesive based composition comprising:
    (i.) a polyimide base polymer having a glass transition temperature between 150 and 300° C., the base polymer being present in a range from 25 to 95 weight percent of the total weight of the polyimide adhesive based composition, the polyimide base polymer having a coefficient of thermal expansion ("CTE") above 50 ppm/° C.,
    (ii.) an aramid micro fiber filler having an average diameter between 0.002 and 2.000 microns and an average length of between $10^1$ and $10^7$ nanometers, the aramid micro fiber filler being present in an amount between 5 and 75 weight percent of the polyimide based adhesive material, wherein the polyimide adhesive based composition provides an overall coefficient of thermal expansion ("CTE") equal to or below 50 ppm/° C.,
    wherein the electronic substrate material is a circuit coverlay layer, a dielectric layer in a flexible polyimide metal-clad laminate, a dielectric layer in a circuit board, or a dielectric layer in a semiconductor device package.

2. An electronic substrate material in accordance with claim 1, wherein the electronic substrate material is dielectric layer in a chip on lead ("COL") package, a chip on flex ("COF") package, a lead on chip ("LOC") package, a multi-chip module ("MCM") package, a ball grid array ("BGA" or "µ-BGA") package, chip scale package ("CSP"), a tape automated bonding ("TAB") package, or a wafer level integrated circuit packaging.

3. An electronic substrate material in accordance with claim 1, wherein the electronic substrate material is a dielectric layer in a, printed wiring board capable of operating above 1 GHz, a planar transformer component of a power supply device, a flexible heater circuit, or a flex/rigid or rigid/flex wiring board.

4. An electronic substrate material composition according to claim 1 further comprising a metal layer, wherein a bond strength between the polyimide based adhesive material and the metal layer, as determined by ASTM Method IPC-TM-650 Method No. 2.4.9.D, is greater than 2 pounds per linear inch (pli).

* * * * *